United States Patent [19]

Tanaka

[11] Patent Number: 5,051,788

[45] Date of Patent: Sep. 24, 1991

[54] LIGHT-EMITTING APPARATUS

[75] Inventor: Yukio Tanaka, Yokohama, Japan

[73] Assignee: Eastman Kodak Company, Rochester, N.Y.

[21] Appl. No.: 576,873

[22] Filed: Sep. 4, 1990

[30] Foreign Application Priority Data

Mar. 22, 1990 [JP] Japan .................................. 2-75097

[51] Int. Cl.[5] ...................... H01L 33/00; H01L 49/02

[52] U.S. Cl. ......................................... 357/17; 357/4; 359/241

[58] Field of Search ...................... 350/353, 354, 356; 357/4, 17

[56] References Cited

U.S. PATENT DOCUMENTS

| | | | |
|---|---|---|---|
| 3,999,144 | 12/1976 | Bret | 350/354 |
| 4,208,667 | 6/1980 | Chang et al. | 350/354 |
| 4,701,030 | 10/1987 | Jewell | 350/354 |
| 4,776,677 | 10/1988 | Park et al. | 350/354 |
| 4,799,227 | 1/1989 | Kaneiwa | 357/17 |

*Primary Examiner*—Jerome Jackson, Jr.
*Attorney, Agent, or Firm*—Raymond L. Owens

[57] ABSTRACT

A light-emitting apparatus comprised of a light-emitting element having a P-N junction light-emitting section in which the decrease in the intensity of the light from the light-emitting element can be maintained at a more or less constant level regardless of changes in the temperature of the light-emitting section.

1 Claim, 3 Drawing Sheets

LIGHT-EMITTING APPARATUS

BACKGROUND OF THE INVENTION

1. Field of the Invention

The present invention relates to a light-emitting apparatus, particularly to such an apparatus constituted by light-emitting diodes or laser diodes.

2. Description of the Prior Art

Light emitting diodes and laser diodes are devices used as light sources in electronic photoprinters, image reading systems and optical communications devices.

These light-emitting devices are constituted as a junction of P and N type semiconductor material to form a light-emitting section which is made to emit light of a prescribed wavelength by applying a forwardly-biased voltage across the P-N junction.

FIG. 10 shows an arrangement in which this type of light-emitting device is used as the light source of an electronic photoprinter. In FIG. 10A a multiplicity of these light-emitting devices are arranged to form an array 10. In this arrangement the light is made to scan by sequentially switching the elements on and off, and the light thus emitted is converged onto a photosensitive member 14 by a rod-array lens 12. In the arrangement shown in FIG. 10B, a polygonal mirror 16 rotating at a prescribed speed is used to scan light emitted from a single light-emitting element 11. In the arrangement shown in FIG. 10C, the photosensitive member 14 is scanned by light from a single light-emitting element 11 which is deflected by means of a mechanical scanning system 18.

A problem with these light-emitting elements used as light sources in electronic photoprinters, image reading systems and optical communications devices is that they have a low energy efficiency, with most of the injected electrical energy being converted into heat in the light-emitting section. This heat raises the temperature of the light-emitting section, which shifts the center frequency of the emitted light towards the longer wavelength side of the spectrum and reduces the light emission intensity.

This decrease in light intensity means a decrease in the intensity of light impinging on the photosensitive member which, in the case of an electronic photoprinter, can degrade the image quality and make it impossible to reproduce tone densities. In the case of an image reader the decrease in light intensity can degrade read accuracy, and in optical communication systems in can produce a deterioration of the signal-to-noise ratio.

SUMMARY OF THE INVENTION

In view of the drawbacks of the conventional arrangements, an object of the present invention is to provide a light-emitting apparatus in which the decrease in the intensity of the light from the light-emitting element can be controlled, enabling the intensity to be maintained at a more or less constant level.

In accordance with the present invention, this object is attained by a light-emitting apparatus comprising a light-emitting element with a P-N junction light-emitting section, and an optical filter provided on the light path between the light-emitting element and the photosensitive member, the change in the transmittivity T of the filter relative to the wavelength λ of the emitted light satisfying $dT/d\lambda \geqq 0$, whereby the intensity of the emitted light can be maintained at a more or less constant level even when there is a rise in the temperature of the light-emitting section.

This object is also attained by a light-emitting apparatus comprising a light-emitting element with a P-N junction light-emitting section, and a reflecting mirror provided on the light path between the light-emitting element and the photosensitive member, the change in the reflectivity R of the mirror relative to the wavelength λ of the emitted light satisfying $dR/d\lambda \geqq 0$, whereby the intensity of the emitted light can be maintained at a more or less constant level even when there is a rise in the temperature of the light-emitting section.

As explained above, in a light-emitting element with a P-N junction light-emitting section, most of the injected electrical energy is converted into heat energy which raises the temperature of the light-emitting section, which causes the center wavelength of the emitted light to undergo a shift to the longer-wavelength side and decreases the intensity of the emitted light.

By subjecting the light from the light-emitting element used to irradiate photosensitive member to intensity modulation by means of an optical filter which absorbs or reflects short wavelength light and transmits more longer-wavelength light, that is, the change in the transmittivity T of the filter relative to the wavelength λ of the emitted light satisfies $dT/d\lambda \geqq 0$, the intensity of the emitted light can be maintained at a more or less constant level even when there is a rise in the temperature of the light-emitting section by using the shift in the wavelength of the emitted light to the longer wavelength side to correct for changes light intensity accompanying the change in temperature. Also, by using a reflecting mirror in which the change in the reflectivity R relative to the wavelength λ of the emitted light satisfies $dR/d\lambda \geqq 0$ and irradiating the photosensitive member with intensity-modulated emitted light coming from this mirror, similarly to when the optical filter described above is used, a more or less constant emitted light intensity can be obtained.

Further features of the invention, its nature and various advantages will be more apparent from the accompanying drawings and following detailed description of the invention.

DETAILED DESCRIPTION OF THE INVENTION

Figure 1A:
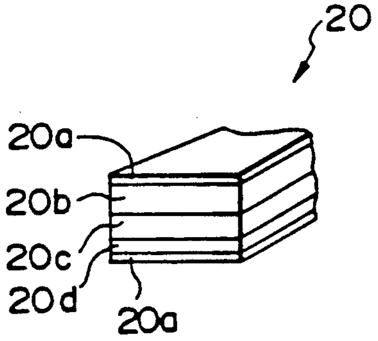
FIG. 1A and 1B are a partial perspective view of a first embodiment of a light-emitting apparatus according to the present invention.
Figure 1B:
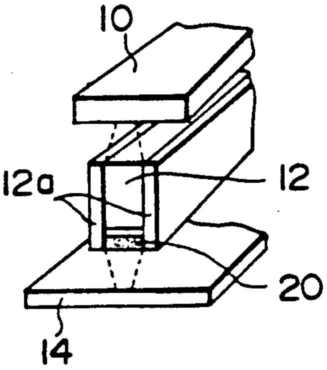

FIG. 1A is a partial perspective view of part of an optical filter 20 and FIG. 1B is a partial perspective view showing the optical filter 20 arranged on the lower surface of a rod-array lens 12 provided between a light-emitting array 10 and a photosensitive member 14.

In this embodiment, the optical filter 20 is formed as a lamination of compound semiconductor layers with different constituent component ratios, with an antireflection layer 20a formed on the upper and lower surfaces. The compound semiconductor layers are a GaP semiconductor crystal layer 20b, a $GnP_{1-x}As_x$ ($x=O-0.61$) semiconductor buffer layer 20c and a $GaP_{0.39}As_{0.61}$ semiconductor crystal layer 20d. Layers 20b and 20c have high transmittivity to light with a wavelength of 653 nm and over, while layer 20d absorbs light with a wavelength below 653 nm corresponding to the energy gap $E_G$ of the compound semiconductor crystal. As a result, the optical filter 20 absorbs light below 653 nm and exhibits a high transmittivity to light above that wavelength, giving it a rate of change in transmittivity T relative to wavelength λ of dT/dλ.

The light-emitting array 10 used in this embodiment is comprised of light-emitting diodes constituted of zinc-diffused $GaAs_{0.4}P_{0.6}$ with tellurium as the N impurity. At room temperature, i.e. 25° C. the light emitted has a center frequency of 660 nm, which increases to 672 nm when the temperature of the light-emitting section rises to 60° C. Hence, by using an arrangement such as the one shown in FIG. 1B in which the optical filter 20 is provided on the lower surface of the rod-array lens 12 and light emitted by the light-emitting array 10 and concentrated by the rod-array lens 12 that is under 653 nm is absorbed and light over 653 nm is transmitted and intensity-modulated onto the photosensitive member 14, even if the light intensity is reduced by a rise in the temperature of the light-emitting diodes of the light-emitting array 10, the shift in center frequency towards the longer wavelength side increases the ratio of light transmitted by the optical filter 20, enabling the decrease in light intensity caused by the rise in temperature to be controlled.

Figure 2:
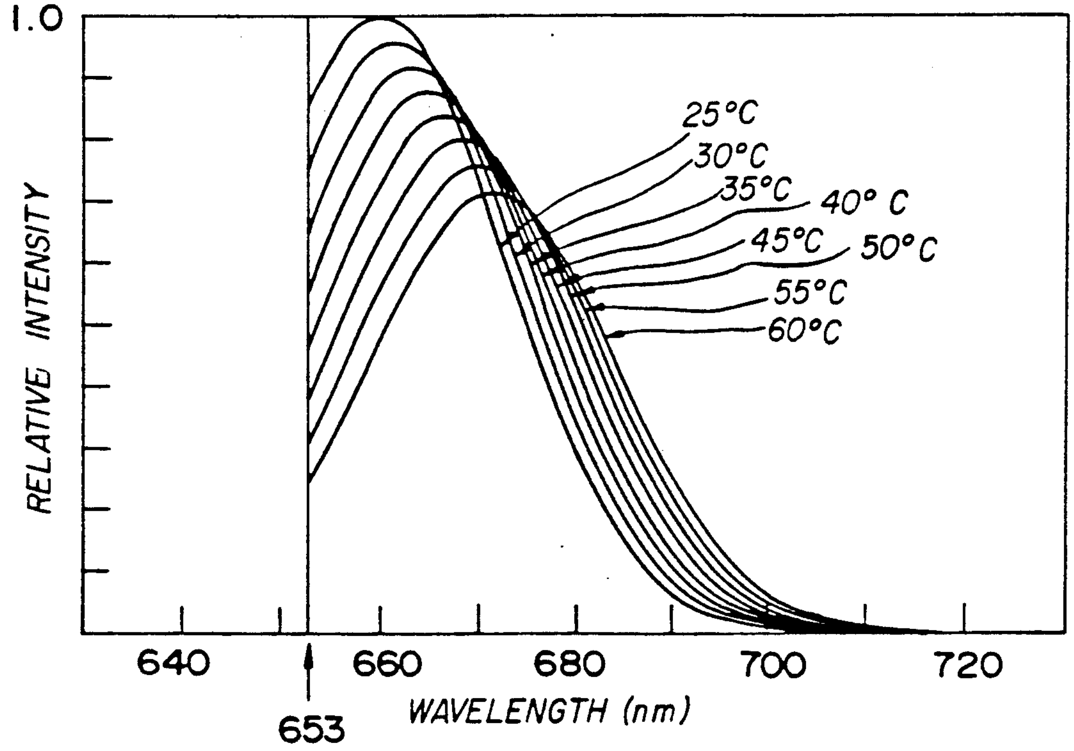
FIG. 2 is a graph of the spectral distribution of the first embodiment.

The spectral distribution of light transmitted by the optical filter 20 in this embodiment is shown in the graph of FIG. 2, plotted at P-N junction light-emitting section temperatures of 25° C., 30° C., 35° C., 40° C., 45° C., 50° C., 55° C. and 60 ° C. In FIG. 2 the horizontal axis represents the wavelength λ (nm) of the light from the light-emitting section and the vertical axis the relative intensity where emitted light with a wavelength of 660 nm has an intensity of 1.0. As the temperature of the light-emitting section rises, the center frequency lengthens at a rate of 33 nm/° C. and the intensity decreases at a rate of 0.82%, but as explained above, the optical filter 20 blocks light which has a wavelength below 653 nm.

Figure 3:
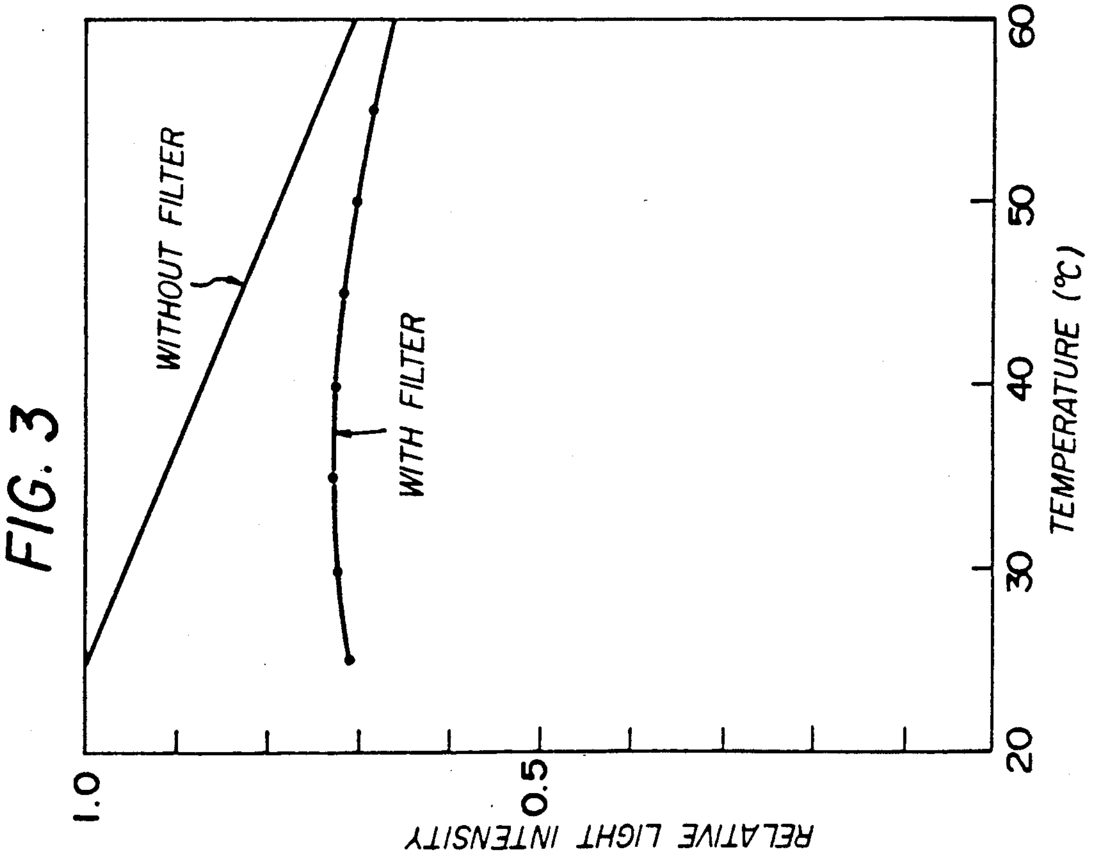
FIGS. 3 and 4 are graphs showing the relationship between the temperature of the light-emitting section of the apparatus and the intensity of the emitted light.

The graph of FIG. 3 was obtained by plotting the relative light intensity by integrating the spectral distributions relative to wavelength against light-emitting section temperature. For comparison, the relative light intensities were plotted when no optical filter was used, that is, light with a wavelength λ below 653 nm was also integrated. Compared with a conventional arrangement which does not use the optical filter 20, as in the case of this embodiment which does use the optical filter 20, shorter-wavelength light, which has a high relative intensity, is blocked, compared with the decrease in the relative light intensity with the conventional arrangement (a decrease of 29% for a 35° C. change in temperature), a relatively constant relative light intensity can be obtained (a decrease of about 7% for a 35° C. change in temperature).

Figure 5:
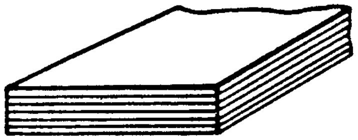
FIG. 5 is a partial perspective view of an optical filter of the embodiment.

In the embodiment described above the optical filter 20 is constituted of semiconductor layers having different constituent component proportions. However, the arrangement of FIG. 5 may be used in which dielectric layers having different refractive indexes are used to form an optical filter in which the rate of change in transmittivity T satisfies dT/dλ≧0, such as alternating layers of silicon oxide and titanium oxide.

Figure 4:
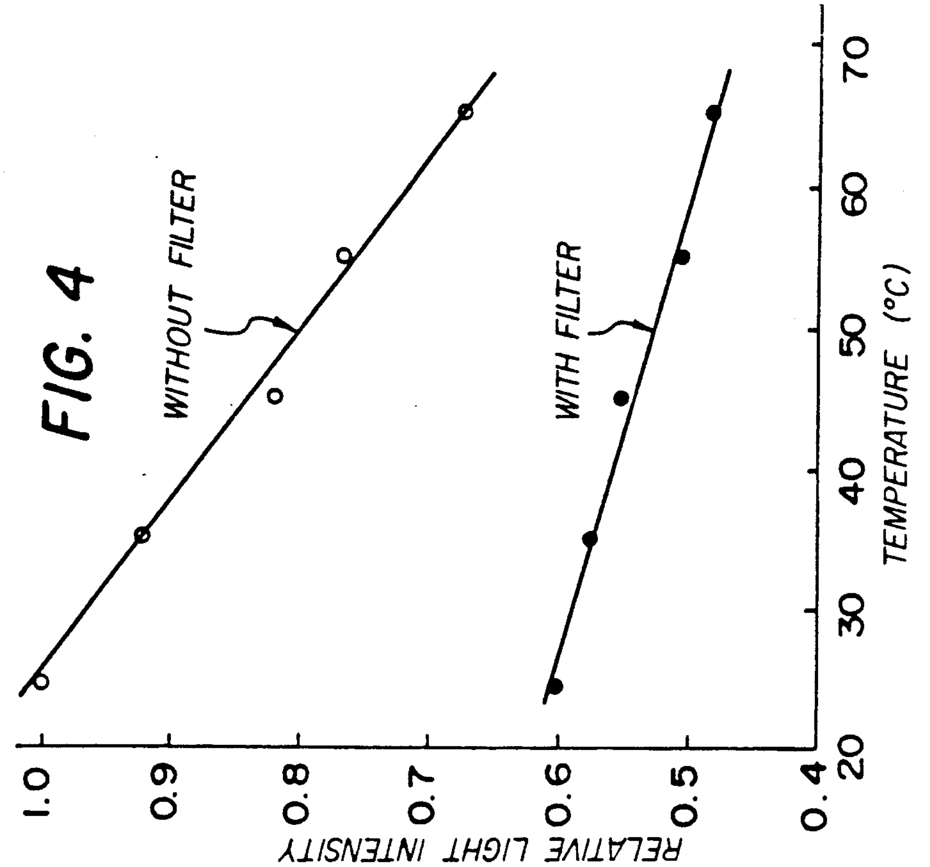

The optical filter could also be formed as a rod-array lens tinted to absorb light below a specific wavelength, or as an object similarly tinted. FIG. 4 shows the relationship between temperature relative intensity of light emitted by a light-emitting diode with an emission frequency of 655 nm and a peak width at half height of 22 nm, using a tinted filter and without a tinted filter. From the graph it can be seen that when the filter is used the decrease is kept to around −0.294/° C. for a temperature that goes from 25° C. to 65° C., compared with −0.81%/° C. when the filter is not used.

Figure 6:
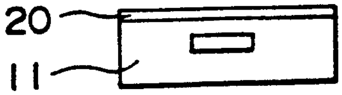
FIGS. 6 and 7 show the positioning of the optical filter.
Figure 7:
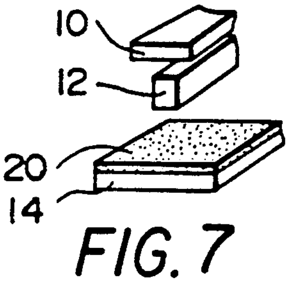

Moreover, although in this embodiment the optical filter 20 is provided on the lower surface of the rod-array lens 12, the filter may equally well be placed at any desired position on the light path between the light-emitting section of the device and the photosensitive member on which the light is made to impinge. As shown in FIG. 6, the filter optical filter 20 could also be provided on the upper surface of a light-emitting element having a P-N junction located within, or it could be located above the photosensitive member, as depicted in FIG. 7.

Also, although in this embodiment the light-emitting element and the optical filter are constituted of GaAsP, other compound semiconductors such as GaAs, GaAlAs, GaP and InGaP can be used to form the light-emitting element.

Figure 8:
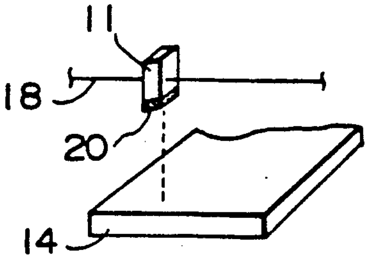
FIG. 8 is a partial perspective view of a second embodiment of a light-emitting apparatus according to the invention.

FIG. 8 is a partial perspective view of a second embodiment of the invention. In this arrangement a single light-emitting element 11 is swung by a mechanical scanning system 18 to project the light onto the photosensitive member. With reference to FIG. 6, the optical filter 20 is formed on the upper surface of the light-emitting element 11 as semiconductor layers of different compositions, dielectric layers with different refractive indexes or as a tinted filter which absorbs light below a certain wavelength, so that more longer-wavelength light than shorter-wavelength light is transmitted, intensity-modulated and projected onto the photosensitive member 14. Therefore even if the temperature of the light-emitting element 11 light-emitting section rises the optical filter 20 enables the light intensity to be kept more or less constant.

Figure 9:
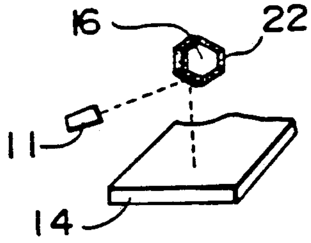
FIG. 9 is a partial perspective view of a third embodiment of a light-emitting apparatus according to the invention.
Figure 10A:
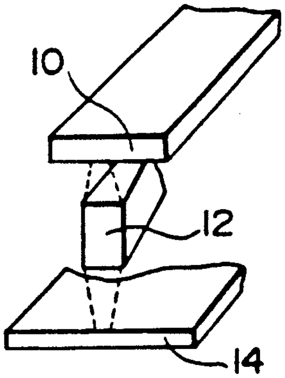
FIG. 10A (PRIOR ART)
FIG. 10A–10C are a partial perspective view of a conventional light-emitting apparatus.
Figure 10B:
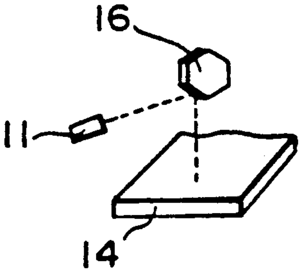
FIG. 10B (PRIOR ART)
Figure 10C:
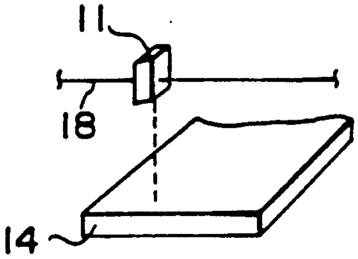
FIG. 10C (PRIOR ART)

A third embodiment is shown in FIG. 9. In this embodiment light from the light-emitting element 11 is deflected to scan the photosensitive member 14 by a polygonal mirror 16 rotating at a prescribed speed. Formed on the surface of the polygonal mirror 16 is a reflecting mirror 22 wherein the reflectivity R to light of wavelength λ emitted by the light-emitting element 11 satisfies dR/dλ≧0. As in the case of the optical filter 20 of the first two embodiments, these reflection properties can be realized with a film consisting of layers of compound semiconductors with different compositions, a tinted object that absorbs light below a specific wavelength, or dielectric layers having different refractive indexes.

In the third embodiment, even if there is a rise in the temperature of the light-emitting element 11 light-emitting section that causes a lengthening of the center frequency and a decrease in the relative light intensity, since substantially only longer-wavelength light is reflected, a substantially constant light intensity can be obtained.

Thus, as described in the foregoing, with the light-emitting apparatus according to this invention, the intensity of light the emitted by a light-emitting element with a P-N junction light-emitting section can be maintained at a more or less constant level even when the temperature of the light-emitting section rises.

Therefore, using this light-emitting apparatus as the light source in an electronic photoprinter would enable high quality prints to be obtained, while in the case of an image reader it would raise the read accuracy. Using it as the light source in optical communication equipment would enable a good signal to noise ratio to be obtained.

The invention has been described in detail with particular reference to certain preferred embodiments thereof, but it will be understood that variations and modifications can be effected within the spirit and scope of the invention.

What is claimed is:

1. A light-emitting apparatus comprising:

a light-emitting element having a P-N junction light-emitting section;

an optical filter including a tinted rod-shaped lens disposed on a light path between the light-emitting element and a photosensitive member which receives light from the lens and in which the change in the transmissivity T of the filter relative to light of wavelength $\lambda$ emitted by the light-emitting element satisfies $dT/d\lambda \geqq 0$; and the filter being configured to transmit light above a particular wavelength but not transmit light below a particular wavelength so that the intensity of the emitted light can be maintained at a more or less constant level regardless of changes in the temperature of the light-emitting section.

* * * * *